United States Patent
Sakaguchi

(10) Patent No.: US 8,536,714 B2
(45) Date of Patent: Sep. 17, 2013

(54) INTERPOSER, ITS MANUFACTURING METHOD, AND SEMICONDUCTOR DEVICE

(75) Inventor: Hideaki Sakaguchi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 13/528,100

(22) Filed: Jun. 20, 2012

(65) Prior Publication Data

US 2012/0326334 A1   Dec. 27, 2012

(30) Foreign Application Priority Data

Jun. 21, 2011   (JP) ................................. 2011-136861

(51) Int. Cl.
*H05K 1/11* (2006.01)
*H05K 1/03* (2006.01)
*H05K 3/00* (2006.01)
*H01L 23/48* (2006.01)

(52) U.S. Cl.
USPC ....................................................... 257/778

(58) Field of Classification Search
USPC .................. 257/685, 686, E21.001–E23.194,
257/E21.499–E21.519, 723, 726,
257/E25.031–E25.032, E23.042, 621, 664–665,
257/734–786, E29.111–E29.165,
257/E23.01–E23.079,
257/E23.141–E23.179, E21.135–E21.21,
257/E21.627, E21.641, E21.575–E21.597
See application file for complete search history.

(56) References Cited

U.S. PATENT DOCUMENTS

| 7,049,170 | B2 * | 5/2006 | Savastiouk et al. | 438/106 |
| 8,039,943 | B2 * | 10/2011 | Harayama et al. | 257/686 |
| 2006/0055050 | A1 * | 3/2006 | Numata et al. | 257/774 |
| 2009/0008792 | A1 * | 1/2009 | Ko et al. | 257/774 |
| 2010/0224977 | A1 * | 9/2010 | Kim | 257/686 |
| 2010/0265751 | A1 * | 10/2010 | Hong | 365/51 |

FOREIGN PATENT DOCUMENTS

JP    2005-64467    3/2005

* cited by examiner

*Primary Examiner* — Dao H Nguyen
*Assistant Examiner* — Tram H Nguyen
(74) *Attorney, Agent, or Firm* — Drinker Biddle & Reath LLP

(57) ABSTRACT

At least one embodiment provides an interposer including: a lower wiring substrate; an upper wiring substrate disposed over the lower wiring substrate via a gap; and through-electrodes which penetrate through the upper wiring substrate and the lower wiring substrate across the gap to thereby link the upper wiring substrate and the lower wiring substrate, portions of the through-electrodes being exposed in the gap.

15 Claims, 9 Drawing Sheets

INTERPOSER, ITS MANUFACTURING METHOD, AND SEMICONDUCTOR DEVICE

CROSS-REFERENCE TO RELATED APPLICATION(S)

This application claims priority/priorities from Japanese Patent Application No. 2011-136861 filed on Jun. 21, 2011, the entire contents of which are incorporated herein by reference.

FIELD

The present invention relates to an interposer having a stress reduction mechanism, its manufacturing method, and a semiconductor device using the interposer.

BACKGROUND

Conventionally, with the miniaturization, thickness reduction and performance enhancement of electronic apparatus, mounting structures in which a semiconductor chip is flip-chip-connected to a mounting board have come to be employed widely. For example, the solder bumps of a semiconductor chip may be flip-chip-connected to the connection electrodes of a mounting board, and the space under the semiconductor chip may be filled with underfill resin. Further, the semiconductor chip may be flip-chip-connected to an interposer, and the interposer may be connected to the mounting board. For example, JP-2005-064467-A is related to such technique.

The thermal expansion coefficient of such semiconductor chip (made of silicon) is much different from that of such mounting board (made of a glass epoxy resin). Therefore, in a heating process for mounting the semiconductor chip, residual stress tends to be concentrated at the joining portions due to thermal stress.

As a result, a joining portion of the semiconductor chip and the mounting board or elements of the semiconductor chip may be broken, that is, the reliability of the electrical connections is insufficient. A similar problem arises also when the semiconductor chip is connected to the mounting board via the interposer of silicon.

SUMMARY

According to one aspect of the present invention, there is provided an interposer including: a lower wiring substrate; an upper wiring substrate disposed over the lower wiring substrate via a gap; and through-electrodes formed to penetrate through the upper wiring substrate and to reach the lower wiring substrate across the gap, thereby linking the upper wiring substrate and the lower wiring substrate, portions of the through-electrodes being exposed in the gap.

In the above-configured interposer, the upper wiring substrate is disposed over the lower wiring substrate so as to be spaced from it (the space is formed between them) and the upper wiring substrate is linked to the lower wiring substrate by the through-electrodes.

Thermal stress can be reduced because a semiconductor chip is flip-chip-connected to the upper wiring substrate (made of silicon or glass) the thermal expansion coefficient of which can be set the same as that of the semiconductor chip.

The thermal expansion coefficient of the lower wiring substrate (made of a resin or ceramics) can be set approximately equal to that of a mounting board (made of a resin). Therefore, when mounting the interposer on the mounting board, thermal stress is reduced and hence the reliability of electrical connections of joining portions can be increased.

Even when thermal stress occurs in or mechanical stress acts on the interposer, the stress can be dispersed by bending of the link portions of the through-electrodes.

DETAILED DESCRIPTION

Figure 1A:
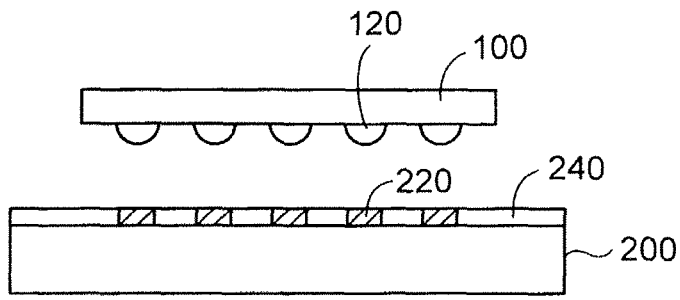
FIGS. 1A-2 cross-sectionally illustrates preliminary items.
Figure 1B:
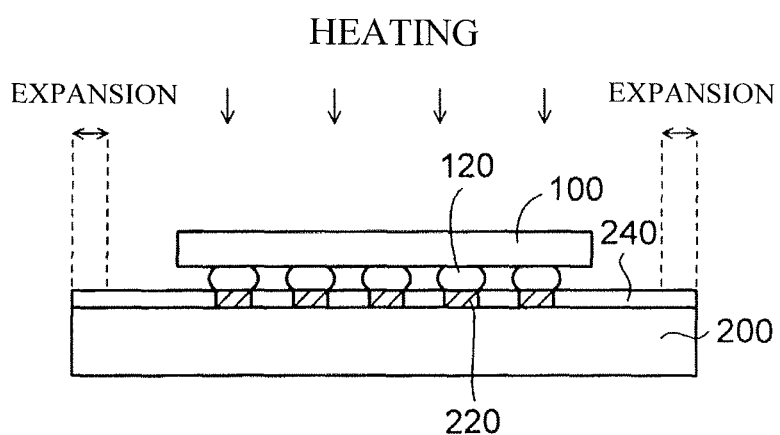
Figure 1C:
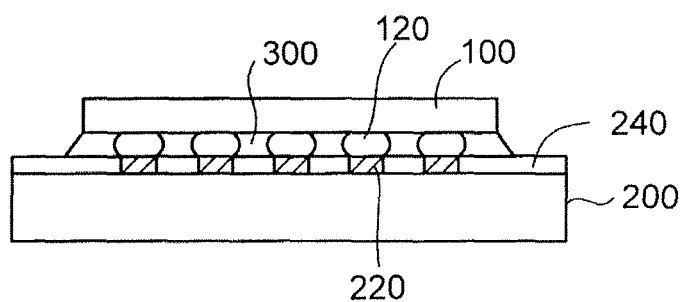
Figure 2:
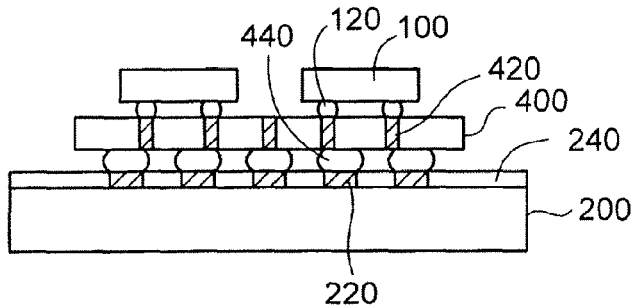

FIGS. 1A-2 cross-sectionally illustrates preliminary items.
As shown in FIG. 1A, first, a semiconductor chip 100 and a mounting board 200 (package board) are prepared. The bottom surface of the semiconductor chip 100 is formed with solder bumps 120.

The mounting board 200 is made of a glass epoxy resin and its top surface is formed with a solder resist layer 240 and connection electrodes 220 exposed therefrom.

Then, as shown in FIG. 1B, solder is applied to the connection electrodes 220 of the mounting board 200, and the solder bumps 120 of the semiconductor chip 100 are placed over the respective connection electrodes 220 of the mounting board 200. Then, reflow soldering is performed by melting the solder by heating it, whereby the semiconductor chip 100 is flip-chip-connected to the mounting board 200.

In the case of lead-free (Pb-free) solder such as tin-silver-copper (Sn—Ag—Cu) solder, heating needs to be performed at a relatively high temperature (about 220° C. to 250° C.).

When the semiconductor chip 100 is made of silicon, a thermal expansion coefficient thereof is 3 to 4 ppm/° C. On the other hand, when the mounting board 200 is made of a glass epoxy resin, a thermal expansion coefficient thereof is 18 ppm/° C. In this case, there is a large difference between these two thermal expansion coefficients.

Therefore, as shown in FIG. 1B, in the heating process for the reflow soldering, the mounting board 200 having the larger thermal expansion coefficient is expanded more than the semiconductor chip 100. Then, after the temperature is lowered to room temperature, the space under the semiconductor chip 100 is filled with an underfill resin layer 300.

When the temperature is lowered to room temperature, the semiconductor chip 100 and the mounting board 200 which have been expanded because of thermal expansion return to their original states.

Here, residual stress is concentrated at the joining portions of the semiconductor chip 100 and the mounting board 200, and the joining portions may be broken.

In other words, a connection portion on the semiconductor chip 100 side, a connection portion on the mounting board 200 side, or a solder bump 120 may be broken to cause a conduction failure. Or internal elements of the semiconductor chip 100 may be broken due to residual stress.

Therefore, the mismatch between the thermal expansion coefficients of the semiconductor chip 100 and the mounting board 200 may deteriorate the reliability of flip-chip-connection, especially when the area of the semiconductor chip 100 is large (to 15 to 20 mm square) and the height of the solder bumps 120 is small.

FIG. 2 illustrates a state where semiconductor chips 100 are flip-chip-connected to a mounting board 200 via a silicon interposer 400. The silicon interposer 400 has through-electrodes 420 for establishing electrical continuity between its top surface and bottom surface. Solder bumps 120 of each semiconductor chip 100 are flip-chip-connected to electrodes formed on the top surface of the silicon interposer 400.

Solder bumps 440 of the silicon interposer 400 are connected to connection electrodes 220 of the mounting board 200 by reflow soldering.

Also when the silicon interposer 400 is used, there is a mismatch between the thermal expansion coefficients of the silicon interposer 400 and the mounting board 200, and thus, joining portions therebetween may be broken due to residual stress.

The above-described problems can be solved by using an interposer according to embodiment which will be described below.

Embodiment

FIGS. 3A-7C cross-sectionally illustrate a manufacturing method of an interposer according to the embodiment. FIG. 8 cross-sectionally illustrates the interposer according to the embodiment.

Figure 3A:
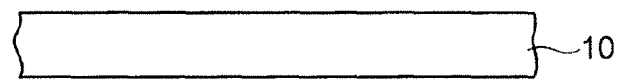
FIGS. 3A-7C illustrate a manufacturing method of an interposer according to the embodiment.

First, as shown in FIG. 3A, a silicon wafer 10 (upper substrate) is prepared. The silicon wafer 10 which is 50 to 200 μm in thickness is obtained by thinning a silicon wafer of 700 to 800 μm in thickness by grinding it with a back grinder (BG).

Figure 3B:
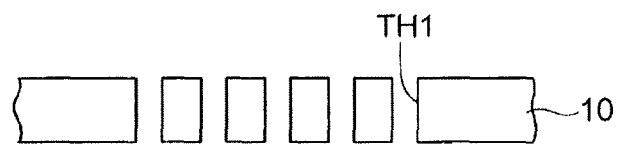

Then, as shown in FIG. 3B, a resist layer (not shown) having openings is formed on the silicon wafer 10 by photolithography and through-holes are formed through the silicon wafer 10 by performing dry etching such as RIE through the openings of the resist layer.

The resist layer is then removed. In this manner, first through-holes TH1 which penetrate through the silicon wafer 10 and reach its top surface and bottom surface are formed. The diameter of the first through-holes TH1 is set at about 50 to 100 μm, for example.

Although FIG. 3B schematically shows only one interposer area of the silicon wafer 10, in reality, the silicon wafer 10 may include many interposer areas each of which is to be formed into an individual interposer.

Figure 3C:
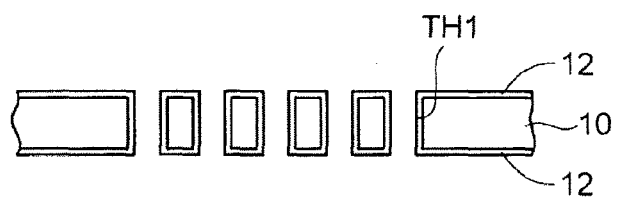

Then, as shown in FIG. 3C, an insulating layer 12 (silicon oxide layer) of about 1 μm in thickness is formed on both surfaces of the silicon wafer 10 and the inner surfaces of the first through-holes TH1 by thermally oxidizing the silicon wafer 10. Alternatively, an insulating layer 12 (silicon oxide layer or silicon nitride layer) may be formed on both surfaces of the silicon wafer 10 and the inner surfaces of the first through-holes TH1 by CVD.

Although the silicon wafer 10 is exemplified as the upper substrate, alternatively, a glass substrate may be used. In this case, it is not necessary to form an insulating layer 12.

Figure 3D:
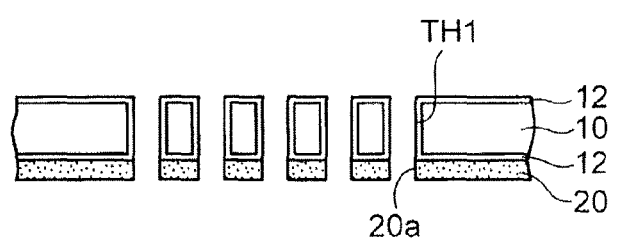

Then, as shown in FIG. 3D, a sacrificial resin layer 20 is formed on one surface (bottom surface) of the silicon wafer 10 to have openings 20a at the same positions as the respective first through-holes TH1 of the silicon wafer 10. Thus, the first through-holes TH1 of the silicon wafer 10 communicate with the respective openings 20a of the sacrificial resin layer 20. For example, a thickness of the sacrificial resin layer 20 is set to 50 to 100 μm.

The sacrificial resin layer 20 will be removed later by wet processing to leave a gap (the other layers will be left). A resist is preferably used as the removable sacrificial resin layer 20. An acrylic resin, a polyimide resin, or the like that are removable by using a dedicated peeling liquid can be used as the removable sacrificial resin layer 20.

For example, to form the sacrificial resin layer 20, a photosensitive resin film (e.g., resist film) is stuck to the silicon wafer 10, and then, openings 20a are formed by photolithography. Alternatively, a liquid resin (e.g., resist) is applied to the silicon wafer 10, and then, openings 20a are formed by photolithography. Still alternatively, a resin film (e.g., resist film) may be formed, and then, openings 20a may be formed by laser processing.

Figure 3E:
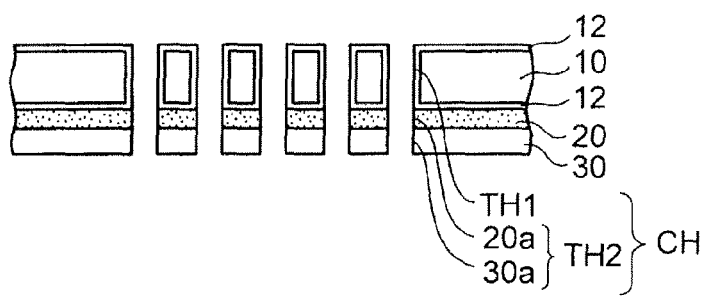

Then, as shown in FIG. 3E, a substrate resin layer 30 (lower substrate) is formed on the outer surface (bottom surface) of the sacrificial resin layer 20 to have openings 30a at the same positions as the first through-holes TH1 of the silicon wafer 10. Thus, second through-holes TH2 are formed by the openings 20a of the sacrificial resin layer 20 and the openings 30a of the substrate resin layer 30, respectively, under the respective first through-holes TH1 of the silicon wafer 10, and the first through-holes TH1 communicate with the respective second through-holes TH2, as continuous through-holes CH.

The substrate resin layer 30 is made of a polyimide resin, an epoxy resin, or the like which is used as a material of interlayer insulating layers for general build-up interconnections and which is a resin that is not removed by (i.e., is resistance to) wet etching for removing the sacrificial resin layer 20.

For example, to form the substrate resin layer 30, a photosensitive resin film is stuck to the sacrificial resin layer 20, and then, openings 30a are formed by photolithography. Alternatively, a liquid resin is applied to the sacrificial resin layer 20, and then, openings 30a are formed by photolithography. Still alternatively, a resin film may be formed, and then, openings 30a may be formed by laser processing.

Although the substrate resin layer 30 is exemplified as the lower substrate which is formed under the sacrificial resin layer 20, alternatively, a ceramic substrate made of alumina or the like may be used. In this case, a ceramic substrate having openings corresponding to the first through-holes TH1 is prepared and bonded to the bottom surface of the sacrificial resin layer 20 with an adhesive. Alternatively, a ceramic substrate may be bonded directly to an adhesive sacrificial resin layer 20 by heating.

Figure 4A:
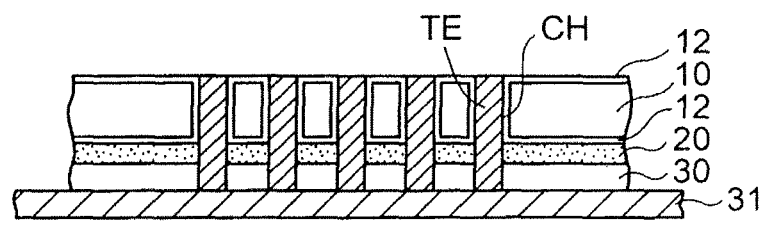

Then, as shown in FIG. 4A, a plating electricity supply member 31 such as a copper plate, a copper foil, or the like is disposed under the structure of FIG. 3E. Metal plating layers made of copper or the like are formed upward in the respective continuous through-holes CH by electrolytic plating using the plating electricity supply member 31 as a plating electricity supply path. The continuous through-holes CH are thus filled with respective through-electrodes TE. The plating electricity supply member 31 is then removed. The through-electrodes TE may be made of gold, instead of nickel.

Alternatively, a plating electricity supply member 31 may be disposed on the top surface, and through-electrodes TE may be formed in the respective continuous through-holes CH by similar electrolytic plating. Still alternatively, through-electrodes TE may be formed by filling the continuous through-holes CH selectively with respective copper plating layers by electroless plating.

Figure 4B:
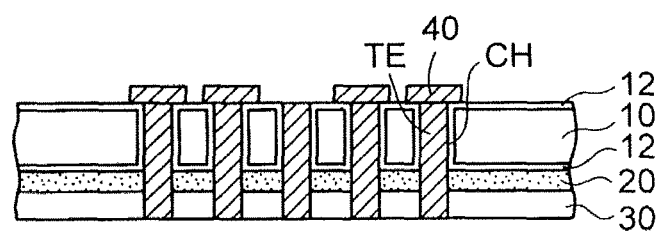

Then, as shown in FIG. 4B, an upper wiring layer 40 is formed on the top surface of the silicon wafer 10 by a semi-additive method, for example, so as to be connected to the top ends of the through-electrodes TE. More specifically, a titanium (Ti)/copper (Cu) layer, for example, is formed as a seed layer (not shown) on the top surface of the silicon wafer 10 by sputtering or electroless plating.

Then, a plating resist layer (not shown) having openings for patterning an upper wiring layer 40 is formed on the seed layer. Subsequently, metal plating layers (not shown) made of copper or the like are formed in the respective openings of the plating resist layer by electrolytic plating using the seed layer as a plating electricity supply path.

After removal of the plating resist layer, portions of the seed layer are etched away using the metal plating layers as a mask, thereby obtaining an upper wiring layer 40 composed of the remaining portions of the seed layer and the metal plating layers.

Figure 4C:
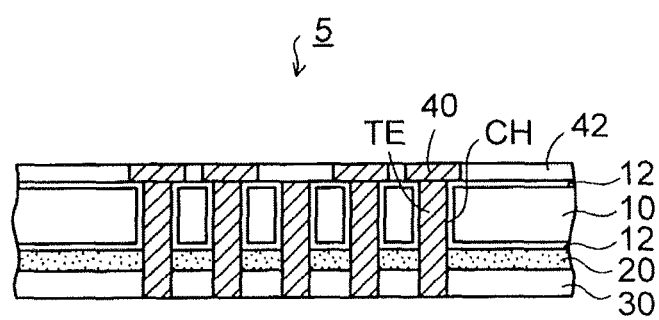

Then, as shown in FIG. 4C, a protective insulating layer 42 is formed by, for example, patterning a solder resist layer so as to expose the upper wiring layer 40 (connection portions of the upper wiring layer 40).

Thus, an intermediate structure 5 for producing the interposer according to the embodiment is obtained. Instead of a method of FIGS. 3A-4C which has been described above, a method of FIGS. 5A-6C which will be described below may be used to obtain almost the same intermediate structure 5.

Figure 5A:
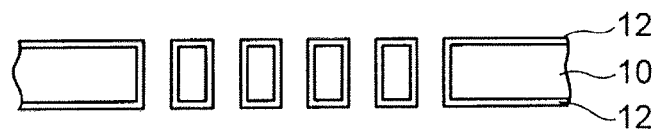

First, as shown in FIG. 5A, after through-holes TH are formed through a silicon wafer 10 in the same manner as shown in FIGS. 3A-3C, an insulating layer 12 is formed on the entire surfaces of the silicon wafer 10.

Figure 5B:
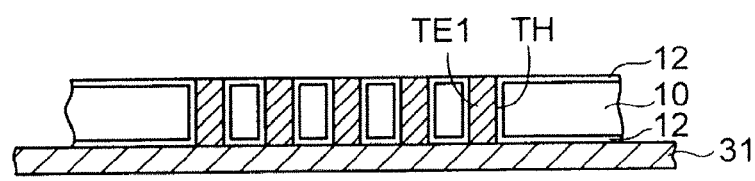

Then, as shown in FIG. 5B, a plating electricity supply member 31 such as a copper plate, a copper foil, or the like is disposed under the bottom surface of the silicon wafer 10. First metal plating electrodes TE1 are formed in the respective through-holes TH of the silicon wafer 10 by electrolytic plating using the plating electricity supply member 31 as a plating electricity supply path. The plating electricity supply member 31 is then removed.

Figure 5C:
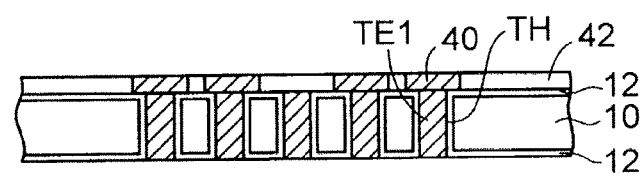

Then, as shown in FIG. 5C, an upper wiring layer 40 is formed on the top surface of the silicon wafer 10 so as to be connected to the top ends of the first through-electrodes TE1 in the same manner as shown in FIG. 4B. Then, a protective insulating layer 42 is formed by, for example, patterning a solder resist layer so as to expose the connection portions of the upper wiring layer 40.

Figure 5D:
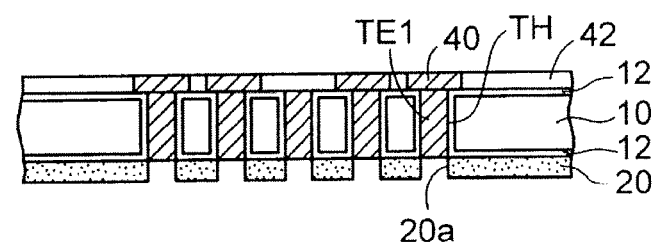

Then, as shown in FIG. 5D, a sacrificial resin layer 20 is formed on the bottom surface of the silicon wafer 10 to have openings 20a at the same positions as the respective through-holes TH (i.e., first through-electrodes TE1) of the silicon wafer 10 in the same manner as shown in FIG. 3D.

Figure 5E:
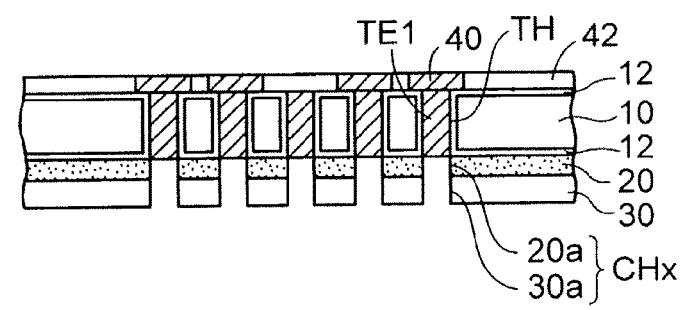

Then, as shown in FIG. 5E, a substrate resin layer 30 is formed on the bottom surface (outer surface) of the sacrificial resin layer 20 to have openings 30a at the same positions as the through-holes TH (i.e., first through-electrodes TE1) of the silicon wafer 10 in the same manner as shown in FIG. 3E.

Thus, the openings 20a of the sacrificial resin layer 20 communicate with the respective openings 30a of the substrate resin layer 30, as continuous holes CHx.

Figure 6A:
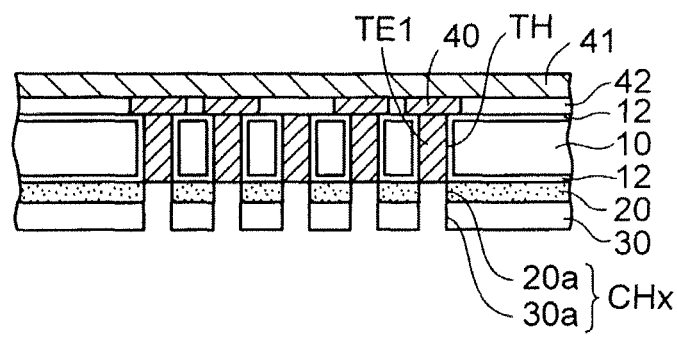
Figure 7A:
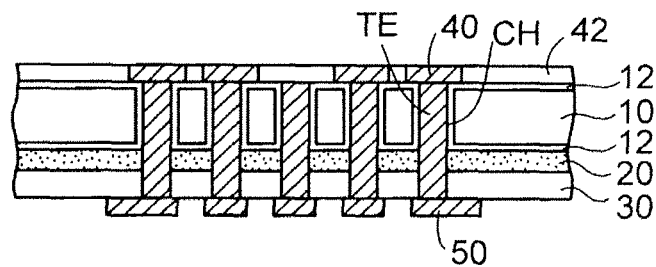

Then, as shown in FIG. 6A, a plating electricity supply layer 41 is formed by sequentially forming a titanium (Ti) layer and a copper (Cu) layer, for example, on the surfaces of the upper wiring layer 40 and the protective insulating layer 42 (see FIG. 5E) by sputtering. The plating electricity supply layer 41 is electrically connected to the first through-electrodes TE1 via the upper wiring layer 40.

Although the plating electricity supply layer 41 seems not to be connected to the first through-electrode TE1 illustrated at a center in FIG. 6A, actually the plating electricity supply layer 41 is connected to that first through-electrode TE1 in a region that is not shown in FIG. 6A and hence the plating electricity supply layer 41 is connected to all the first through-electrodes TE1.

Figure 6B:
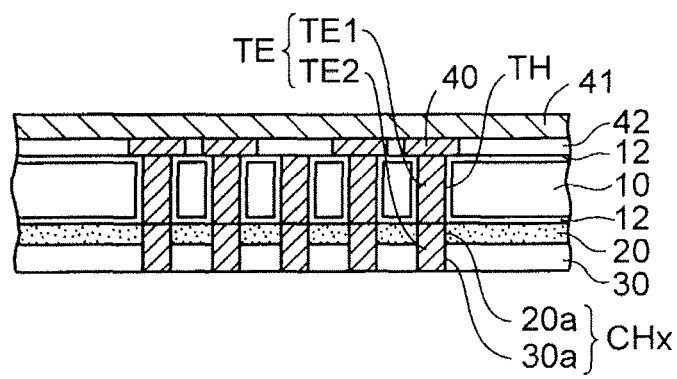

Then, as shown in FIG. 6B, the continuous holes CHx which are located under the respective first through-electrodes TE1 are filled with respective metal plating layers made of copper or the like by electrolytic plating using the plating electricity supply layer 41, the upper wiring layer 40 and the first through-electrodes TE1 as plating electricity supply paths, whereby second through-electrodes TE2 are formed.

Figure 6C:
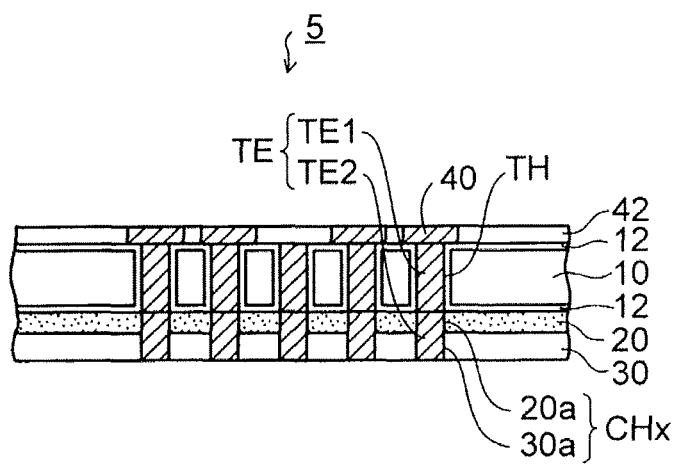

Thus, the first through-electrodes TE1 are connected to the respective second through-electrodes TE2, thereby obtaining through-electrodes TE which penetrate through the silicon wafer 10, the sacrificial resin layer 20 and the substrate resin layer 30. Finally, as shown in FIG. 6C, the plating electricity supply layer 41 is removed.

The second through-electrodes TE2 can be formed by another method. First, in the state of FIG. 5E, a titanium layer and a copper layer are formed sequentially as a seed layer by sputtering on the bottom surface of the substrate resin layer 30 and the inner surfaces of the continuous holes CHx.

Then, a metal plating layer made of copper or the like is formed on the bottom surface of the substrate resin layer 30 and inside the continuous holes CHx (the continuous holes CHx are filled) by electrolytic plating using the seed layer as a plating electricity supply path.

Then, the metal plating layer is polished by CMP or the like until the substrate resin layer 30 is exposed, whereby second through-electrodes TE2 remain in the respective continuous holes CHx and through-electrodes TE are obtained. In this method, the step of forming the upper wiring layer 40 may be executed after the formation of the through-electrodes TE.

Thus, an intermediate structure 5 having almost the same structure as shown in FIG. 4C can be obtained as shown in FIG. 6C.

Subsequent steps will be described with an assumption that the intermediate structure 5 shown in FIG. 4C is used. As shown in FIG. 7A, a first lower wiring layer 50 is formed on the bottom surface of the intermediate structure 5 so as to be connected to the bottom ends of through-electrodes TE. Like the upper wiring layer 40 shown in FIG. 4B, the first lower wiring layer 50 is formed by a semi-additive method, for example.

Figure 7B:
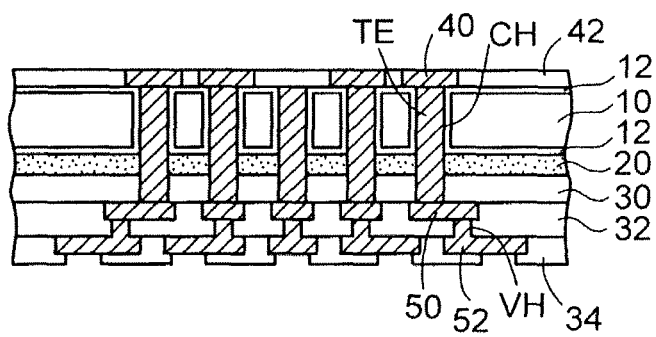
Figure 8:
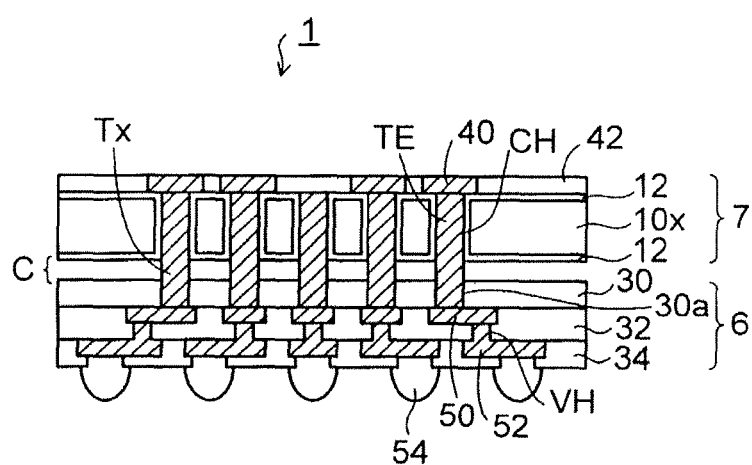
FIG. 8 cross-sectionally illustrates the interposer according to the embodiment.

Then, as shown in FIG. 7B, an interlayer insulating layer 32 is formed on the substrate resin layer 30 so as to cover the first lower wiring layer 50, and via holes VH are formed through the interlayer insulating layer 32 by laser processing so as to reach the first lower wiring layer 50. The interlayer insulating layer 32 is formed by sticking a resin sheet made of an epoxy resin, a polyimide resin, or the like.

Alternatively, when an interlayer insulating layer 32 is made of a photosensitive resin, via holes VH may be formed by photolithography. Still alternatively, a liquid resin may be applied instead of sticking a resin sheet.

Then, as shown in FIG. 7B, a second lower wiring layer 52 is formed on the interlayer insulating layer 32 so as to be connected to the first lower wiring layer 50 through the via holes VH. The second lower wiring layer 52 is also formed by a semi-additive method, for example.

Then, a protective insulating layer 34 is formed by, for example, patterning a solder resist layer so as to expose the connection portions of the second lower wiring layer 52. If necessary, contact layers are formed by performing nickel/gold plating on the connection portions of the upper wiring layer 40 and the connection portions of the second lower wiring layer 52.

That is, the first lower wiring layer 50 and the second lower wiring layer 52 are formed to realize pitch conversion from the narrow pitch of the upper wiring layer 40 corresponding to a semiconductor chip to the wide pitch corresponding to connection electrodes of a mounting board.

Thus, a resin wiring substrate 6 (lower wiring substrate) is formed in which the wiring layers (first lower wiring layer 50 and second lower wiring layer 52) connected to the through-electrodes TE and the insulating layers (interlayer insulating layer 32 and protective insulating layer 34) are laid on the substrate resin layer 30.

Figure 7C:
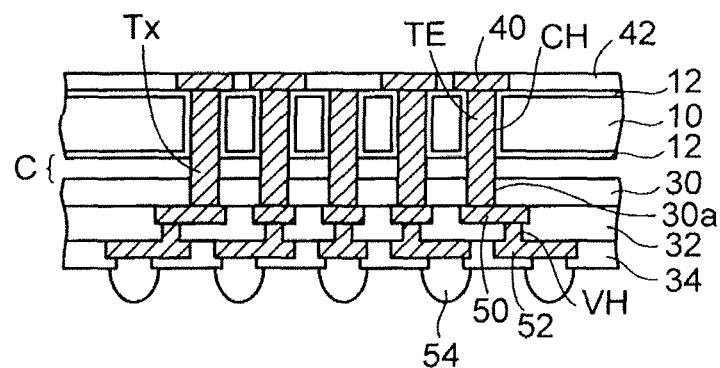

Then, as shown in FIG. 7C, the structure of FIG. 7B is immersed in a peeling liquid (etching liquid) for the sacrificial resin layer 20, whereby the sacrificial resin layer 20 is removed while the other layers are left. Where the sacrificial resin layer 20 is a resist layer, it can be removed easily with a resist stripper (resist peeling liquid).

As a result, the sacrificial resin layer 20 to leave a gap C is obtained between the silicon wafer 10 and the substrate resin layer 30, thereby separating them from each other.

Here, the through-electrodes TE pass across the gap C in the vertical direction with their link portions Tx exposed in the gap C. A length of the link portions Tx may be about 50 to 100 μm, correspondingly with the thickness of the sacrificial resin layer 20.

Since the removal of the sacrificial resin layer 20 horizontally proceeds from the edge of the silicon wafer 10, especially when the silicon wafer 10 is large, it takes long time.

In order to accelerate the removal of the sacrificial resin layer 20, removal holes may be formed to vertically penetrate through the substrate resin layer 30, the interlayer insulating layer 32 and the protective insulating layer 34 so as to reach the sacrificial resin layer 20. Since the resist stripper is supplied to the sacrificial resin layer 20 also through the removal holes, the removal can be finished in a short time. Alternatively, removal holes may likewise be formed through the silicon layer 10 so as to reach the sacrificial resin layer 20.

As also shown in FIG. 7C, external connection terminals 54 are formed by, for example, forming solder balls under the respective connection portions of the second lower wiring layer 52. Then, with prescribed timing before or after mounting of semiconductor chips, the structure of FIG. 7C is cut vertically into individual interposers.

An interposer 1 according to the embodiment is thus obtained as shown in FIG. 8. FIG. 8 shows a case that the structure of FIG. 7C is cut before mounting of a semiconductor chip.

As shown in FIG. 8, the interposer 1 according to the embodiment is provided with a resin wiring substrate 6 (lower wiring substrate) and a silicon wiring substrate 7 (upper wiring substrate), which are separated from each other via the gap C.

The silicon wiring substrate 7 is provided with the through-electrodes TE so as to penetrate therethrough in its thickness direction. The through-electrodes TE pass across the gap C and go into the resin wiring substrate 6. The link portions Tx of the through-electrodes TE exist in the gap C, that is, between the resin wiring substrate 6 and the silicon wiring substrate 7. That is, the side surfaces of the link portions Tx of the through-electrodes TE are exposed in the gap C.

The resin wiring substrate 6 and the silicon wiring substrate 7 are thus linked to each other by the through-electrodes TE.

In the silicon wiring substrate 7, continuous through-holes CH are formed through a silicon substrate 10x, and the insulating layer 12 is formed on both surfaces of the silicon substrate 10x and the inner surfaces of the respective continuous through-holes CH. The continuous through-holes CH are filled with the respective through-electrodes TE.

The upper wiring layer 40 is formed on the top surface of the silicon substrate 10x so as to be connected to the top ends of the respective through-electrodes TE. The protective insulating layer 42 is also formed on the top surface of the silicon substrate 10x so as to expose the connection portions of the upper wiring layer 40.

In the resin wiring substrate 6, the first lower wiring layer 50 is formed on the bottom surface (outer surface) of the substrate resin layer 30. The through-electrodes TE which penetrate through the silicon substrate 10x and pass across the gap C also penetrate through the substrate resin layer 30, and the bottom ends of the respective through-electrodes TE are connected to the first lower wiring layer 50.

The interlayer insulating layer 32 is formed on the bottom surface (outer surface) of the substrate resin layer 30 so as to cover the first lower wiring layer 50. The via holes VH are formed through the interlayer insulating layer 32 so as to reach the first lower wiring layer 50. And the second lower wiring layer 52 is formed on the bottom surface (outer surface) of the interlayer insulating layer 32 so as to be connected to the first lower wiring layer 50 through the via holes VH.

The protective insulating layer 34 is formed on the bottom surface (outer surface) of the interlayer insulating layer 32 so as to expose the connection portions of the second lower wiring layer 52. The connection portions of the second lower wiring layer 52 are provided with the respective external connection terminals 54.

As described above, in the interposer 1 according to the embodiment, the through-electrodes TE which pass across the gap C link the resin wiring substrate 6 and the silicon wiring substrate 7.

The upper wiring layer 40 (pads) of the silicon wiring substrate 7 is electrically connected via the through-electrodes TE to the first lower wiring layer 50 which is electrically connected to the second lower wiring layer 52 (pads) in the resin wiring substrate 6.

Pitch conversion from the narrow pitch of the upper wiring layer 40 corresponding to a semiconductor chip to the wide pitch corresponding to connection electrodes of a mounting board is realized by the first lower wiring layer 50 and the second lower wiring layer 52. For example, the pitches of the upper wiring layer 40 and the second lower wiring layer 52 are set at 150 μm and 300 to 500 μm, respectively.

In the interposer 1 according to the embodiment, the silicon wiring substrate 7 serves as the upper wiring substrate which is to be mounted with a semiconductor chip (made of silicon) and the resin wiring substrate 6 serves as the lower wiring substrate which is to be mounted on a mounting board (made of a glass epoxy resin).

With this structure, since the semiconductor chip (made of silicon) is flip-chip-mounted on the silicon wiring substrate 7 having the same thermal expansion coefficient as the semiconductor chip, thermal stress that occurs when mounting the semiconductor chip is reduced and hence residual stress occurring in the joining portions can be weakened.

Although the silicon wiring substrate 7 is illustrated as the upper wiring substrate, as mentioned above, a glass substrate (thermal expansion coefficient: 3 to 10 ppm/° C.) whose thermal expansion coefficient can be set approximately equal to the thermal expansion coefficient of the semiconductor chip (made of silicon) may be used. The same advantage can be obtained also in this case.

Furthermore, the resin wiring substrate 6 is disposed under the silicon wiring substrate 7 with the gap C, and the resin wiring substrate 6 is linked to the silicon wiring substrate 7 by the through-electrodes TE. Having no core substrate (rigid substrate), the resin wiring substrate 6 functions as a flexible substrate. Therefore, even if thermal stress occurs when the interposer 1 is mounted on a mounting board after a semiconductor chip has been mounted on the silicon wiring substrate 7, for example, the stress can be dispersed by the flexible resin wiring substrate 6.

In addition, the thermal expansion coefficient of the resin wiring substrate 6 can be set to 18 to 30 ppm/° C., that is, set approximately equal to the thermal expansion coefficient (18 ppm/° C.) of a mounting board (made of a glass epoxy resin). Therefore, thermal stress that occurs when mounting the interposer 1 on the mounting board is reduced and hence residual stress occurring in the joining portions can be weakened.

Although the resin wiring substrate 6 is exemplified as the lower wiring substrate, as mentioned above, a ceramic substrate made of alumina or the like may be used. The thermal expansion coefficient (8 to 10 ppm/° C.) of the ceramic substrate is set around the middle between the thermal expansion coefficient (18 ppm/° C.) of a mounting board (made of a glass epoxy resin) and the thermal expansion coefficient (3 to 4 ppm/° C.) of the silicon wiring substrate 7.

Since the ceramic wiring substrate whose thermal expansion coefficient is around the middle between the thermal expansion coefficients of the silicon wiring substrate 7 and the mounting board, thermal stress is reduced and hence residual stress occurring in the joining portions can be weakened.

Still further, the resin wiring substrate 6 and the silicon wiring substrate 7 are spaced from each other by the gap C (they are not in direct contact with each other) and the link portions Tx of the through-electrodes TE are exposed in the gap C. Being integral metal plating layers which are made of copper or the like and have no joints, the through-electrodes TE function as rigid posts.

Therefore, even if thermal stress occurs in the interposer 1, the stress can be dispersed by bending of the link portions Tx of the through-electrodes TE. The interposer 1 is also highly resistant to external mechanical stress.

Next, a method for manufacturing a semiconductor device using the interposer 1 according to the embodiment will be described.

Figure 9:
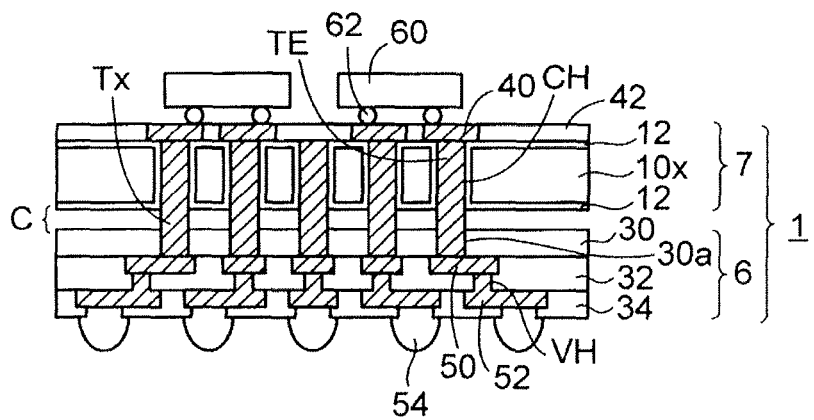
FIG. 9 illustrates a state where semiconductor chips are flip-chip-connected to the interposer of FIG. 8.

As shown in FIG. 9, first, semiconductor chips 60 (LSI chips) each having solder bumps 62 on its bottom surface are prepared. Each semiconductor chip 60 is obtained by cutting a silicon wafer which is formed with various elements such as transistors.

Solder is applied to the upper wiring layer 40 of the interposer 1 (see FIG. 8) and the solder bumps 62 of each semiconductor chip 60 are placed over the upper wiring layer 40 of the interposer 1. Reflow soldering is performed by heating. As a result, the semiconductor chip 60 is flip-chip-connected to the interposer 1.

Since the semiconductor chip 60 (made of silicon) and the silicon wiring substrate 7 of the interposer 1 have the same thermal expansion coefficient, thermal stress is reduced and hence residual stress occurring in the joining portions can be weakened. The same advantage can be obtained also in the case where a glass wiring substrate is used as the upper wiring substrate in place of the silicon wiring substrate 7.

Figure 10:
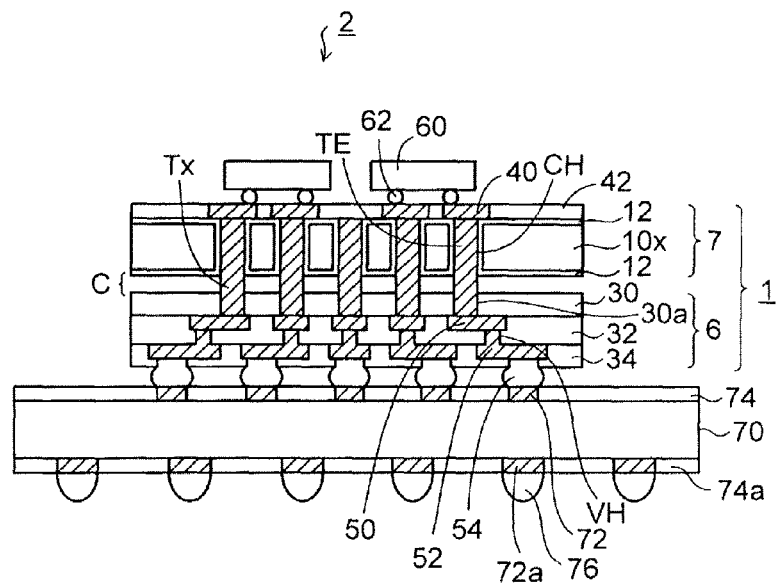
FIG. 10 illustrates a state where the semiconductor chips are connected to a mounting board via the interposer of FIG. 8, as a semiconductor device.

Then, a mounting board 70 is prepared as shown in FIG. 10. The mounting board 70 is made of an organic substrate containing a resin such as a glass epoxy resin and functions as a wiring board of a semiconductor package. The top surface of the mounting board 70 is formed with connection electrodes 72 and is fully covered with a protective insulating layer 74 except that the connection electrodes 72 are exposed.

Likewise, the bottom surface of the mounting board 70 is formed with connection electrodes 72a and is fully covered with a protective insulating layer 74a except that the connection electrodes 72a are exposed. The connection electrodes 72 and the connection electrodes 72a are respectively connected to each other by internal interconnections in the mounting board 70.

The connection electrodes 72a which are formed on the bottom surface of the mounting board 70 are provided with respective external connection terminals 76.

The external connection terminals 54 (solder balls) formed on the bottom surface of the interposer 1 (see FIG. 9) which is mounted with the semiconductor chips 60 are placed over the respective connection electrodes 72 of the mounting board 70, and reflow soldering is performed by heating. As a result, the semiconductor chips 60 are electrically connected to the mounting board 70 via the interposer 1.

A semiconductor device 2 according to the embodiment is thus obtained.

Since the resin wiring substrate 6 of the interposer 1 and the mounting board 70 have approximately the same thermal expansion coefficient, thermal stress is reduced and hence residual stress occurring in the joining portions can be weakened. The same advantage can be obtained also in the case where a ceramic wiring substrate is used as the lower wiring substrate in place of the resin wiring substrate 6.

Since the resin wiring substrate 6 is spaced from the silicon wiring substrate 7 via the gap C and is linked to the silicon wiring substrate 7 by the through-electrodes TE, the resin wiring substrate 6 functions as a flexible substrate. Therefore, even if thermal stress occurs in the interposer 1, the stress can be dispersed by the flexible resin wiring substrate 6.

Where lead-free (Pb-free) solder such as tin-silver-copper (Sn—Ag—Cu) solder is used, heating needs to be performed at a relatively high temperature (about 220° C. to 250° C.). Even in such a case, by using the interposer 1 according to the embodiment, semiconductor devices 2 can be manufactured with a high yield so that joining portions thereof are highly reliable.

High reliability of the joining portions can be secured even in the case where the semiconductor chips 60 have large areas or their solder bumps are low in height because of pitch reduction.

Furthermore, the link portions Tx of the through-electrodes TE are exposed in the gap C between the resin wiring substrate 6 and the silicon wiring substrate 7. Therefore, thermal stress occurs in or mechanical stress acts on the interposer 1, the stress can be dispersed by bending of the link portions Tx of the through-electrodes TE.

As described above, connecting the semiconductor chips 60 to the mounting board 70 via the interposer 1 having the stress reduction mechanism according to the embodiment prevents concentration of residual stress in the joining portions of each semiconductor chip 60 and the interposer 1.

This prevents problems that, for example, a joining portion of a semiconductor chip 60 and the interposer 1 is broken or elements of a semiconductor chip 60 are broken, whereby the semiconductor device 2 is given high reliability.

By using of the interposer 1 having the stress reduction mechanism, in the semiconductor device 2 according to the embodiment, sufficient reliability of the joining portions can be secured even if, for example, the spaces under the semiconductor chips 60 are not filled with underfill resin.

Figure 11:
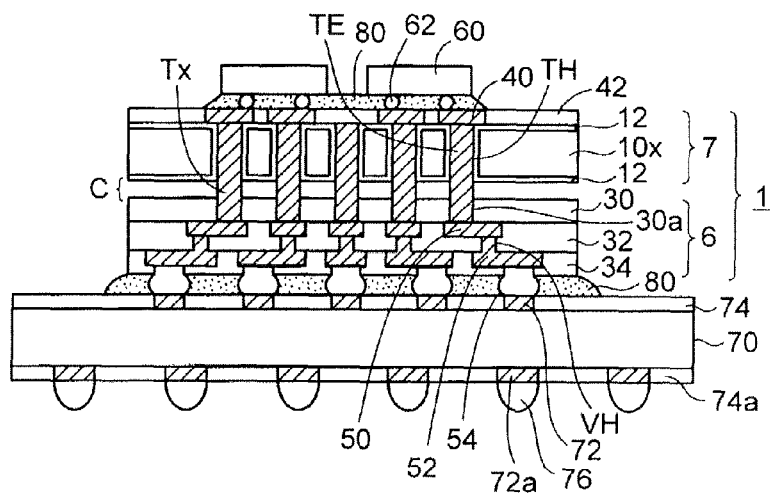
FIG. 11 illustrates a state where the spaces under the semiconductor chips and the interposer are filled with underfill resin.

As shown in FIG. 11, the spaces between the semiconductor chips 60 and the interposer 1 and the space between the interposer 1 and the mounting board 70 may be filled with underfill resin layers 80, as necessary. Since the joining portions are sealed with the underfill resin layers 80, stress is dispersed further and hence the reliability of the electrical connections can be increased further.

Figure 12:
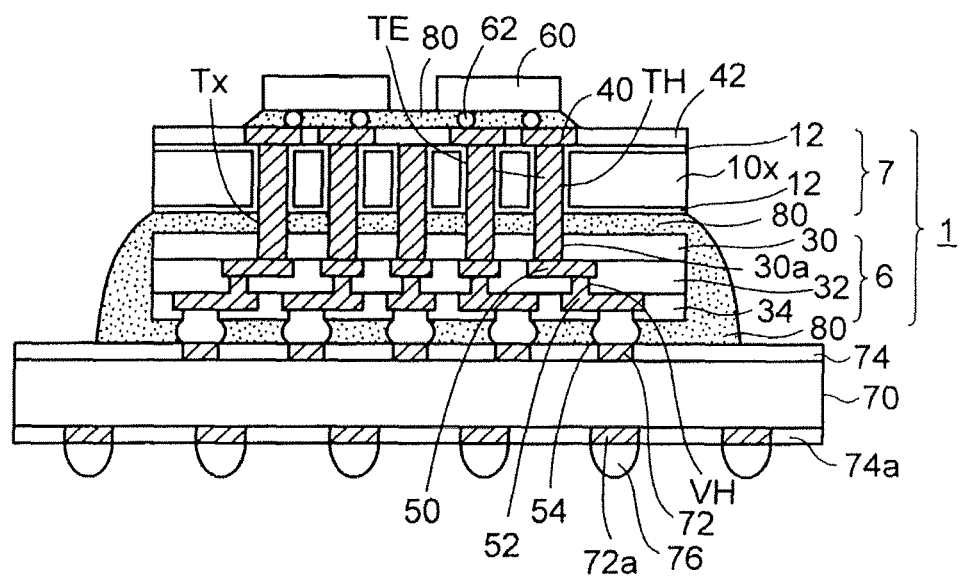
FIG. 12 illustrates a state where the gap of the interposer is further filled with underfill resin.

As shown in FIG. 12, the gap C of the interposer 1 may be further filled with the underfill resin layer 80.

The invention claimed is:

1. An interposer comprising:
   a lower wiring substrate including:
      a substrate resin layer having openings;
      a wiring layer formed on one surface of the substrate resin layer; and
      an interlayer insulating layer formed on the one surface of the substrate resin layer to cover the wiring layer;
   an upper wiring substrate disposed to face the other surface of the substrate resin layer of the lower wiring substrate via a gap; and
   through-electrodes formed
      to penetrate through the upper wiring substrate,
      to contactingly enter into the respective openings of the lower wiring substrate across the gap, and
      to electrically connect to the wiring layer,
      thereby linking the upper wiring substrate and the lower wiring substrate,
   wherein portions of the through-electrodes are exposed in the gap.

2. The interposer of claim 1, wherein the upper wiring substrate is made of silicon or glass, and the lower wiring substrate is made of a resin or ceramic.

3. The interposer of claim 1, wherein a thermal expansion coefficient of the upper wiring substrate is set approximately the same as a thermal expansion coefficient of a semiconductor chip to be mounted on the upper wiring substrate.

4. The interposer of claim 1,
   wherein the upper wiring substrate has pads formed on a top surface thereof, and the lower wiring substrate has pads formed on a bottom surface thereof, and
   wherein the pads of the upper wiring substrate are electrically connected to the pads of the lower wiring substrate via the through-electrodes, respectively.

5. A semiconductor device comprising:
   the interposer of claim 1;
   a semiconductor chip flip-chip-connected to a wiring layer which is formed on a top surface of the upper wiring substrate; and
   a mounting board connected to connection terminals which are formed on a bottom surface of the lower wiring substrate.

6. The semiconductor device of claim 5, wherein the mounting board is an organic substrate containing a resin.

7. A method for manufacturing an interposer, comprising:
   forming through-holes through an upper substrate;
   forming, on one surface of the upper substrate, a sacrificial resin layer to have openings at the same positions as the respective through-holes;
   forming, on an outer surface of the sacrificial resin layer, a resin layer to have openings at the same positions as the respective through-holes, so that continuous through-holes are formed by the respective through-holes, the respective openings of the sacrificial resin layer and the respective openings of the resin layer;
   forming through-electrodes in the respective continuous through-holes;
   forming, on an outer surface of the resin layer, a lower wiring substrate by laying a lower wiring layer and an insulating layer, the lower wiring layer being connected to the through-electrodes; and
   removing the sacrificial resin layer to leave a gap between the resin layer and the upper substrate.

8. A method for manufacturing an interposer, comprising:
   forming through-holes through an upper substrate;
   forming first through-electrodes in the respective through-holes;
   forming, on one surface of the upper substrate, a sacrificial resin layer to have openings at the same positions as the respective through-holes;
   forming, on an outer surface of the sacrificial resin layer, a resin layer to have openings at the same positions as the respective through-holes, so that continuous holes are formed by the respective openings of the sacrificial resin layer and the respective openings of the resin layer;
   forming second through-electrodes in the respective continuous holes such that the second through-electrodes are connected to the respective first through-electrodes, and thereby obtaining through-electrodes to penetrate through the upper substrate, the sacrificial resin layer and the resin layer;
   forming, on an outer surface of the resin layer, a lower wiring substrate by laying a lower wiring layer and an insulating layer, the lower wiring layer being connected to the through-electrodes; and
   removing the sacrificial resin layer to leave a gap between the resin layer and the upper substrate.

9. The method of claim 7, further comprising: forming, on a top surface of the upper substrate, an upper wiring layer connected to top ends of the respective through-electrodes.

10. The method of claim 7, wherein the upper substrate is made of silicon or glass.

11. The method of claim 8, further comprising: forming, on a top surface of the upper substrate, an upper wiring layer connected to top ends of the respective through-electrodes.

12. The method of claim 8, wherein the upper substrate is made of silicon or glass.

13. The interposer of claim 1, wherein the wiring layer of the lower wiring substrate and the through-electrodes are formed in one unitary piece.

14. The interposer of claim 1, wherein a hole is formed in the lower wiring substrate to penetrate through the substrate resin layer and the interlayer insulating layer.

15. The interposer of claim 14, wherein the hole is formed to allow a resist stripper to be supplied from a bottom face of the lower wiring substrate to reach a sacrificial resin layer which was disposed between the lower wiring substrate and the upper wiring substrate to remove the sacrificial resin layer and form the gap.

* * * * *